United States Patent
Fujii et al.

(10) Patent No.: US 11,699,375 B1
(45) Date of Patent: Jul. 11, 2023

(54) SEMICONDUCTOR DEVICE AND DISPLAY DRIVER IC USING THE SAME

(71) Applicant: Samsung Electronics Co., Ltd., Suwon-si (KR)

(72) Inventors: Hiroki Fujii, Suwon-si (KR); Jae-Hyun Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/968,407

(22) Filed: Oct. 18, 2022

(51) Int. Cl.
*G09G 3/20* (2006.01)
*H01L 29/10* (2006.01)

(52) U.S. Cl.
CPC ........... *G09G 3/20* (2013.01); *H01L 29/1041* (2013.01); *G09G 2310/0291* (2013.01)

(58) Field of Classification Search
CPC .............. G09G 3/20; G09G 2310/0291; H01L 29/1041
See application file for complete search history.

(56) References Cited

U.S. PATENT DOCUMENTS

| | | | |
|---|---|---|---|
| 8,304,320 | B2 | 11/2012 | Bahl et al. |
| 8,471,316 | B2 | 6/2013 | Tai et al. |
| 8,558,310 | B2 | 10/2013 | Nandakumar et al. |
| 8,981,490 | B2 | 3/2015 | Nandakumar |
| 9,865,507 | B2 | 1/2018 | Hao et al. |
| 10,566,191 | B1 | 2/2020 | Weeks et al. |
| 11,094,818 | B2 | 8/2021 | Takeuchi et al. |
| 2010/0127331 | A1 | 5/2010 | Ratnakumar et al. |
| 2014/0001553 | A1 | 1/2014 | Imura |
| 2018/0031936 | A1* | 2/2018 | Enami ................. G02F 1/13452 |
| 2018/0033355 | A1* | 2/2018 | Lee ........................ H10K 59/88 |
| 2018/0033362 | A1* | 2/2018 | Yamazaki ............ G06V 20/635 |
| 2018/0033391 | A1* | 2/2018 | So ........................ G09G 3/3696 |

FOREIGN PATENT DOCUMENTS

CN 111092120 A 5/2020

OTHER PUBLICATIONS

A. Chatterjee et al., 'Transistor Design Issues in Integrating Analog Functions with High Performance Digital CMOS' 1999 Symposium on VLSI Technology Digest of Technical Papers, pp. 147-148.

\* cited by examiner

*Primary Examiner* — Sejoon Ahn
(74) *Attorney, Agent, or Firm* — Harness, Dickey & Pierce, P.L.C.

(57) ABSTRACT

A semiconductor device includes a semiconductor substrate including an active region defined in a well impurity layer having a first conductivity type, a gate electrode on the active region, and a gate insulating layer between the gate electrode and the active region. The active region includes a source region and a drain region at sides of the gate electrode, the source region and the drain region having a second conductivity type, a channel region between the source and drain regions, the channel region having the first conductivity type, a first halo region in contact with the source region and a second halo region in contact with the drain region, the first halo region and the second halo region having the first conductivity type, and a slit well region between the first and second halo regions, the slit well region having the first conductivity type.

20 Claims, 10 Drawing Sheets

US 11,699,375 B1

SEMICONDUCTOR DEVICE AND DISPLAY DRIVER IC USING THE SAME

CROSS-REFERENCE TO RELATED APPLICATIONS

This U.S. non-provisional patent application claims priority under 35 U.S.C. § 119 to Korean Patent Application No. 10-2022-0038766, filed on Mar. 29, 2022, in the Korean Intellectual Property Office, the entire contents of which are hereby incorporated by reference.

FIELD

Some of the example embodiments relate to a semiconductor device and/or a display driver IC using the same, and may include a metal-oxide-semiconductor (MOS) transistor with improved output resistance.

BACKGROUND

A semiconductor device includes an integrated circuit including metal-oxide-semiconductor field-effect transistors (MOS-FETs). As an integration density of the semiconductor device increases, the MOS-FETs are being aggressively scaled down, but this leads to deterioration in operational characteristics of the semiconductor device. Thus, a variety of studies are being conducted to overcome technical limitations associated with the scale-down of the semiconductor device and to realize high-performance semiconductor devices.

SUMMARY

An example embodiment of the inventive concepts provides a semiconductor device with improved output resistance.

An example embodiment of the inventive concepts provides a display driver IC which includes a semiconductor device with improved output resistance.

According to an example embodiment of the inventive concepts, a semiconductor device includes a semiconductor substrate including an active region, the active region defined in a well impurity layer having a first conductivity type, a gate electrode on the active region, and a gate insulating layer between the gate electrode and the active region. The active region comprises a source region and a drain region, the source region at a first side of the gate electrode, the drain region at a second side of the gate electrode, and the source region and the drain region having a second conductivity type, a channel region between the source and drain regions, the channel region having the first conductivity type, a first halo region in contact with the source region and a second halo region in contact with the drain region, the first halo region and the second halo region having the first conductivity type, and a slit well region between the first and second halo regions, the slit well region having the first conductivity type, wherein a top surface of the slit well region is in contact with a bottom surface of the gate insulating layer.

According to an example embodiment of the inventive concepts, a semiconductor device includes a semiconductor substrate including an active region, the active region defined in a well impurity layer having a first conductivity type, a gate electrode on the active region, and a gate insulating layer between the gate electrode and the active region. The active region comprises a source region at a first side of the gate electrode and a drain region at a second side of the gate electrode, the source region and the drain region having a second conductivity type, a channel region between the source and drain regions, the channel region having the first conductivity type, a first halo region in contact with the source region and a second halo region in contact with the drain region, the first halo region and the second halo region having the first conductivity type, and a slit well region between the first and second halo regions, the slit well region having the first conductivity type. A top surface of the channel region comprises a first point in contact with the source region, a second point in contact with the drain region, a third point at a center point of the top surface, a fourth point between the first and third points, and a fifth point between the third and second points, wherein the first and second points have a first dopant concentration, wherein the third point has a second dopant concentration, wherein the fourth and fifth points have a third dopant concentration, wherein the third dopant concentration is lower than the first dopant concentration, and wherein the third dopant concentration is lower than the second dopant concentration.

According to an example embodiment of the inventive concepts, a display driver integrated circuit (IC) includes a source driver including an amplifier circuit, and a gate driver, wherein the source driver and the gate driver are configured to drive a pixel of a display panel. A metal-oxide-semiconductor (MOS) transistor of the amplifier circuit comprises a semiconductor substrate including a well impurity layer having a first conductivity type, a source region and a drain region in an upper portion of the well impurity layer, the source region and the drain region spaced apart from each other in a first direction, and the source region and the drain region having a second conductivity type, a channel region between the source and drain regions, the channel region having the first conductivity type, a slit well region at a center point of the channel region, the slit well region having the first conductivity type, and a gate electrode on the channel region. The gate electrode has a first length in the first direction, wherein a top surface of the slit well region has a second length in the first direction, and wherein a ratio of the second length to the first length is in a range from 0.2 to 0.6.

DETAILED DESCRIPTION

Some example embodiments of the inventive concepts will now be described more fully with reference to the accompanying drawings, in which example embodiments are shown.

Figure 1:
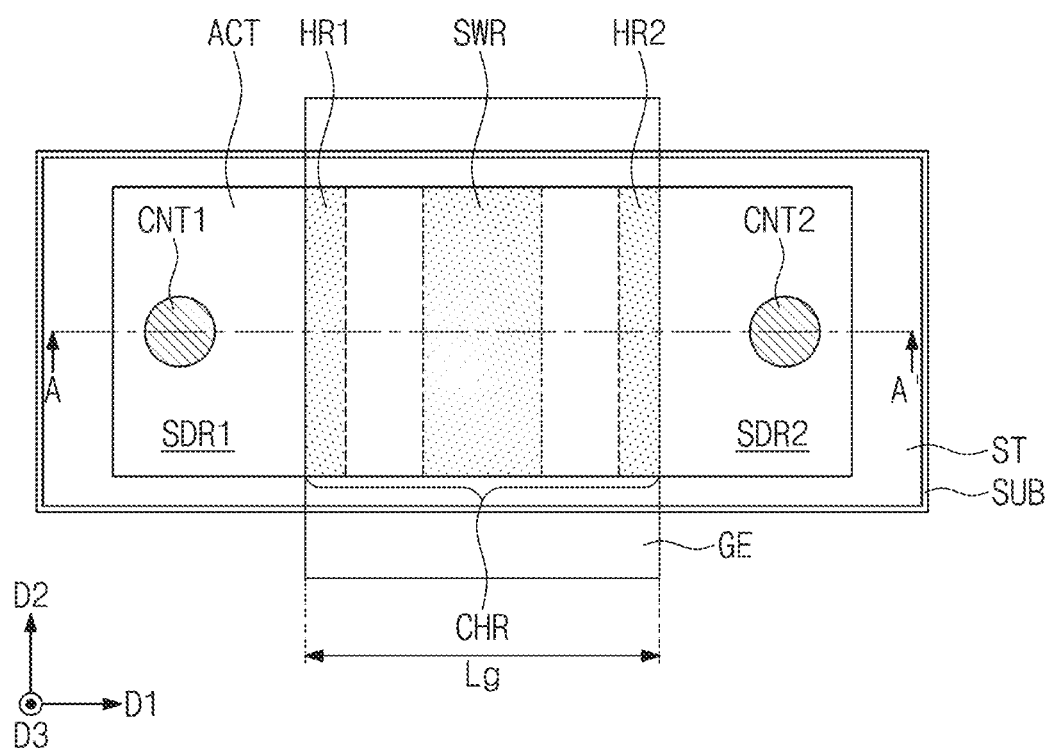
FIG. 1 is a plan view illustrating a semiconductor device according to an example embodiment of the inventive concepts.
Figure 2:
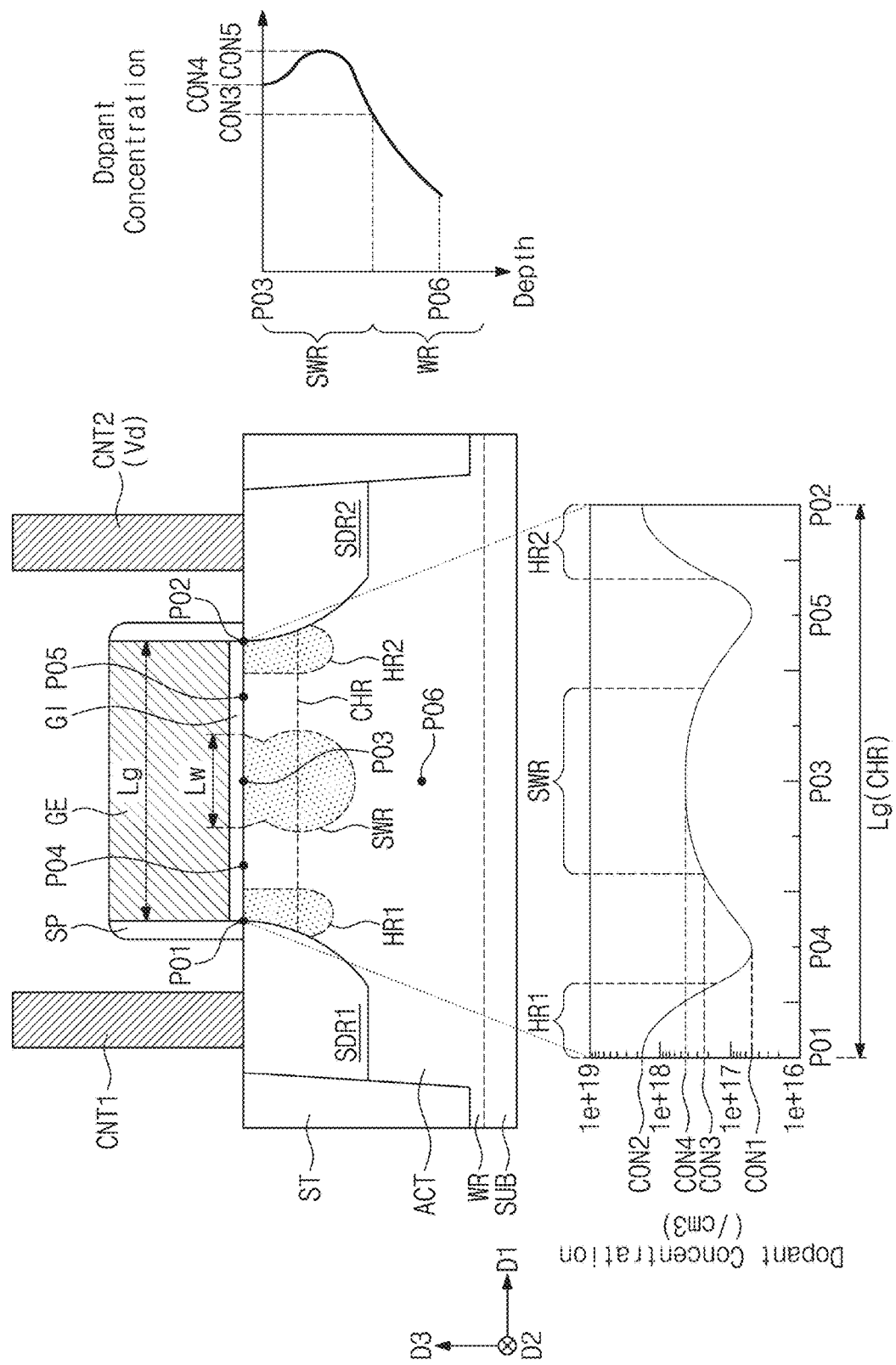
FIG. 2 is a sectional view taken along a line A-A' of FIG. 1.

FIG. 1 is a plan view illustrating a semiconductor device according to an example embodiment of the inventive concepts. FIG. 2 is a sectional view taken along a line A-A' of FIG. 1.

Referring to FIGS. 1 and 2, a semiconductor substrate SUB including an active region ACT may be provided. The semiconductor substrate SUB may include a bulk silicon wafer, a silicon-on-insulator (SOI) wafer, a germanium wafer, a germanium-on-insulator (GOI) wafer, a silicon-germanium wafer, or a thin wafer including an epitaxial layer formed by a selective epitaxial growth (SEG) process, but example embodiments are not limited thereto.

A well impurity layer WR may be provided in the semiconductor substrate SUB. The well impurity layer WR may be located in an upper portion of the semiconductor substrate SUB. The well impurity layer WR may be formed by injecting first impurities (e.g., boron ions) into the semiconductor substrate SUB. Due to the injected first impurities, the well impurity layer WR may have a first conductivity type.

In some example embodiments the semiconductor device is an NMOS transistor, and the first conductivity type of the well impurity layer WR may be a p-type. For example, a concentration of the first impurities (e.g., boron (B)) in the well impurity layer WR may be in a range from about $1.0$ $E16$ $atom/cm^3$ to about $1.0$ $E17$ $atom/cm^3$. In some example embodiments the semiconductor device is a PMOS transistor, and the first conductivity type of the well impurity layer WR may be an n-type.

A device isolation layer ST defining the active region ACT may be formed in the well impurity layer WR. When viewed in a plan view, the device isolation layer ST may be provided to enclose the active region ACT. The device isolation layer ST may include at least one of a high density plasma (HDP) oxide layer, a boron-phosphor silicate glass (BPSG) layer, an undoped silicate glass (USG) layer, or a spin-on-glass (SOG) layer, but example embodiments are not limited thereto. In an example embodiment, a top surface of the device isolation layer ST may be coplanar or substantially coplanar with a top surface of the semiconductor substrate SUB. In another example embodiment, the top surface of the device isolation layer ST may protrude from the top surface of the semiconductor substrate SUB.

A gate electrode GE may be disposed on the active region ACT. As an example, the gate electrode GE may be extended in a second direction D2 to cross the active region ACT. A gate insulating layer GI may be provided between the gate electrode GE and the active region ACT.

The gate electrode GE may be formed of or include at least one of doped semiconductor materials, conductive metal nitride materials, or metallic materials. In an example embodiment, the gate electrode GE may be formed of or include doped polysilicon. The gate electrode GE may further include a conductive metal nitride layer and a metal layer, which are stacked on a poly-silicon layer.

In another example embodiment, the gate electrode GE may include a metal nitride layer and a metal layer. The metal nitride layer may be formed of or include at least one of titanium nitride, tantalum nitride, tungsten nitride, hafnium nitride, or zirconium nitride. The metal layer may be formed of or include at least one of tungsten, copper, hafnium, zirconium, titanium, tantalum, aluminum, ruthenium, palladium, platinum, cobalt, or nickel, but example embodiments are not limited thereto.

The gate insulating layer GI may include a silicon oxide layer, a high-k dielectric layer, or a multiple layer including a silicon oxide layer and a high-k dielectric layer. The high-k dielectric layer may be formed of or include a high-k dielectric material having a higher dielectric constant than the silicon oxide layer. For example, the high-k dielectric material may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but example embodiments are not limited thereto. In an example embodiment, the gate insulating layer GI may include a thermal oxide layer, which is formed by thermally oxidizing a top surface of the semiconductor substrate SUB.

The active region ACT may include source and drain regions SDR1 and SDR2, which are respectively provided at both sides of the gate electrode GE. For example, the source region SDR1 may be adjacent to a side of the gate electrode GE, and the drain region SDR2 may be adjacent to an opposite side of the gate electrode GE. The source and drain regions SDR1 and SDR2 may be disposed in the well impurity layer WR. Each of the source and drain regions SDR1 and SDR2 may be located below a gate spacer SP.

The source and drain regions SDR1 and SDR2 may be formed by injecting second impurities (e.g., phosphorus (P)) into the well impurity layer WR using the gate electrode GE as an ion injection mask. The source and drain regions SDR1 and SDR2 may have a second conductivity type (e.g., n-type).

The second impurities may have substantially the same concentration at upper and lower portions in each of the source and drain regions SDR1 and SDR2. The concentration of the second impurities (e.g., phosphorus (P)) in each of the source and drain regions SDR1 and SDR2 may be in a range from about $1.0$ $E20$ $atom/cm^3$ to about $1.0$ $E21$ $atom/cm^3$.

Gate spacers SP may be respectively provided on opposite side surfaces of the gate electrode GE. The gate spacers SP may be disposed on the source and drain regions SDR1 and SDR2, respectively. The gate spacer SP may be formed of or include an insulating material (e.g., silicon oxide and/or silicon nitride).

The active region ACT may include a channel region CHR, which are provided below the gate electrode GE and is of the first conductivity type (e.g., p-type). A top surface of the channel region CHR may be in contact with a bottom surface of the gate insulating layer GI. The channel region CHR may be interposed between the source and drain regions SDR1 and SDR2, which are spaced apart from each other in a first direction D1. A length of the channel region CHR in the first direction D1, which is called a gate length, may be a first length Lg. The first length Lg may be equal to a distance between the source and drain regions SDR1 and SDR2 in the first direction D1.

Since the channel region CHR contains the first impurities (e.g., boron), it may have a first conductivity type (e.g., p-type). Except for first and second halo regions HR1 and HR2 and a slit well region SWR, which will be described below, a concentration CON1 of the first impurities in the channel region CHR may be equal to or higher than a dopant concentration of the well impurity layer WR. For example, the concentration CON1 of the first impurities in the channel region CHR may be in a range from about $1.0\,E16$ atom/cm$^3$ to about $1.0\,E17$ atom/cm$^3$.

The active region ACT may include a first halo region HR1 in contact with the source region SDR1 and a second halo region HR2 in contact with the drain region SDR2. Since the first and second halo regions HR1 and HR2 contains the first impurities (e.g., boron), the first and second halo regions HR1 and HR2 may have the first conductivity type (e.g., p-type). An upper portion of each of the first and second halo regions HR1 and HR2 may constitute a portion of the channel region CHR. A top surface of each of the first and second halo regions HR1 and HR2 may be in contact with the bottom surface of the gate insulating layer GI.

A bottom of each of the first and second halo regions HR1 and HR2 may be higher than a bottom of each of the source and drain regions SDR1 and SDR2. The bottom of each of the first and second halo regions HR1 and HR2 may be lower than a bottom of the channel region CHR.

The highest concentration CON2 of the first impurities in each of the first and second halo regions HR1 and HR2 may be higher than the concentration CON1 of the first impurities in the channel region CHR. The first and second halo regions HR1 and HR2 may inhibit or prevent a short channel effect (e.g., a punch-through phenomenon) from occurring in a MOS transistor according to some example embodiments.

According to an example embodiment of the inventive concepts, the active region ACT may further include the slit well region SWR, which is provided near a center of the channel region CHR. Referring back to FIG. 2, the slit well region SWR may be extended from the top surface of the channel region CHR toward a bottom surface of the semiconductor substrate SUB. A section of the slit well region SWR in FIG. 2 may have a circular, elliptical, pear, or pot shape, but example embodiments are not limited thereto. A width or length of the slit well region SWR in the first direction D1 may be increased and then decreased, as a height from a bottom of the slit well region SWR in a third direction D3 increases, and then may be increased again as a distance to a top surface of the active region ACT decreases.

A bottom of the slit well region SWR may be higher than the bottom of each of the source and drain regions SDR1 and SDR2. The bottom of the slit well region SWR may be lower than the bottom of each of the first and second halo regions HR1 and HR2.

Referring back to FIG. 1, the slit well region SWR may be a bar or line shape extending in the second direction D2, when viewed in a plan view. However, the planar shape of the slit well region SWR is not limited to the example of FIG. 1. In an example embodiment, the slit well region SWR may be provided to have a wavy or island shape, when viewed in a plan view.

Referring back to FIGS. 1 and 2, since the slit well region SWR includes the first impurities (e.g., boron), the slit well region SWR may have a first conductivity type (e.g., p-type). An upper portion of the slit well region SWR may constitute a portion of the channel region CHR. A top surface of the slit well region SWR may be in contact with the bottom surface of the gate insulating layer GI.

A concentration of the first impurities in the slit well region SWR may be higher than the concentration CON1 of the first impurities in the channel region CHR. The concentration of the first impurities in the slit well region SWR may be lower than the highest dopant concentration CON2 in each of the first and second halo regions HR1 and HR2. However, in another example embodiment, the highest dopant concentration CON4 or CON5 in the slit well region SWR may be higher than the highest dopant concentration CON2 in each of the first and second halo regions HR1 and HR2. The concentration of the first impurities in the slit well region SWR may be in a range from about $2.0\,E17$ atom/cm$^3$ to about $1.0\,E19$ atom/cm$^3$. For example, the slit well region SWR may be a region, which is located between the first and second halo regions HR1 and HR2 and has a first dopant concentration higher than about $2.0\,E17$ atom/cm$^3$.

The top surface of the slit well region SWR may have a second length Lw in the first direction D1. The second length Lw may be smaller than the first length Lg. A ratio (Lw/Lg) of the second length Lw to the first length Lg may be in a range from 0.2 to 0.7. In an example embodiment, the ratio (Lw/Lg) of the second length Lw to the first length Lg may be in a range from 0.2 to 0.6. More specifically, the ratio (Lw/Lg) of the second length Lw to the first length Lg may be in a range from 0.3 to 0.6. In some example embodiments the ratio (Lw/Lg) of the second length Lw to the first length Lg is smaller than 0.2, and an increase of an output resistance Rout, which will be described below, may be weakly affected by the presence of the slit well region SWR. In some example embodiments the ratio (Lw/Lg) of the second length Lw to the first length Lg is higher than 0.7, and the output resistance Rout may be suddenly reduced by the slit well region SWR.

A first contact CNT1 and a second contact CNT2 may be provided on the source and drain regions SDR1 and SDR2, respectively. A source voltage may be applied to the source region SDR1 through the first contact CNT1. A drain voltage Vd may be applied to the drain region SDR2 through the second contact CNT2.

A doping profile of the first impurities on the top surface of the channel region CHR will be described in more detail with reference to FIG. 2. The top surface of the channel region CHR may include a first point PO1 in contact with the source region SDR1, a second point PO2 in contact with the drain region SDR2, and a third point PO3 between the first and second points PO1 and PO2. The third point PO3 may be located at a center of the top surface of the channel region CHR. The top surface of the channel region CHR may further include a fourth point PO4 between the first and third points PO1 and PO3 and a fifth point PO5 between the second and third points PO2 and PO3.

The first and second points PO1 and PO2 may be included in the first and second halo regions HR1 and HR2, respectively, and the third point PO3 may be included in the slit well region SWR. The fourth and fifth points PO4 and PO5 may be included in the channel region CHR, except for the first and second halo regions HR1 and HR2 and the slit well region SWR.

FIG. 2 shows a doping profile of the first impurities, in the first direction D1, from the first point PO1 to the second point PO2. The dopant concentration at each of the first and second points PO1 and PO2 may be the second concentration CON2. The second concentration CON2 may be equal or substantially equal to the highest dopant concentration in each of the first and second halo regions HR1 and HR2 described above.

In a region from the first point PO1 toward the fourth point PO4, the dopant concentration may be decreased from the second concentration CON2 to the first concentration CON1. The first concentration CON1 may be a dopant concentration of the fourth point PO4. The first concentration CON1 may be the lowest value in the impurity doping profile shown in FIG. 2. The first concentration CON1 may be a dopant concentration of the channel region CHR, except for the first and second halo regions HR1 and HR2 and the slit well region SWR.

In a region from the fourth point PO4 toward the third point PO3, the dopant concentration may be increased from the first concentration CON1 to a fourth concentration CON4. The fourth concentration CON4 may be a dopant concentration of the third point PO3. The fourth concentration CON4 may be the highest dopant concentration of the slit well region SWR. The slit well region SWR at a surface of the channel region CHR may be defined as a region having a dopant concentration between a third concentration CON3 and the fourth concentration CON4.

The third concentration CON3 may be used as a reference value defining a border of the slit well region SWR. The third concentration CON3 may be higher than the first concentration CON1. As an example, the third concentration CON3 may be determined to be equal or similar to the lowest dopant concentration in each of the first and second halo regions HR1 and HR2. For example, the third concentration CON3 may be set to a value of about 2.0 E17 atom/cm$^3$. That is, the slit well region SWR may be defined as a region, which is within the channel region except for the first and second halo regions HR1 and HR2 and has a dopant concentration higher than about 2.0 E17 atom/cm$^3$.

The third concentration CON3 of the slit well region SWR may be defined as a value that is 3 to 20 times the first concentration CON1 of the channel region CHR. That is, a ratio CON3/CON1 of the third concentration CON3 to the first concentration CON1 may be in a range from 3 to 20.

In a region from the third point PO3 toward the fifth point PO5, the dopant concentration may be decreased from the fourth concentration CON4 to the first concentration CON1 again. In a region from the fifth point PO5 toward the second point PO2, the dopant concentration may be increased from the first concentration CON1 to the second concentration CON2 again.

According to an example embodiment of the inventive concepts, the dopant concentration of the channel region CHR may be increased until it reaches the highest value CON4 and then may be decreased, when measured in the first direction D1 in a region excluding the first and second halo regions HR1 and HR2. This is because the slit well region SWR in some example embodiments is located at the center of the channel region CHR.

Hereinafter, a doping profile of the first impurities from the top surface of the channel region CHR to a lower portion of the well impurity layer WR will be described with reference to FIG. 2. The well impurity layer WR may include a sixth point PO6 below the slit well region SWR. The sixth point PO6 may be vertically overlapped with the third point PO3.

A dopant concentration at the third point PO3 may be the fourth concentration CON4 described above. In a region from the third point PO3 toward the sixth point PO6, the dopant concentration may be increased until it reaches its highest value (e.g., a fifth concentration CON5). The fifth concentration CON5 may be the highest dopant concentration in the slit well region SWR. The fifth concentration CON5 may be 1-2 times the fourth concentration CON4. In a deep region lower than the fifth concentration CON5, the dopant concentration may be gradually decreased from the fifth concentration CON5.

Figure 3:
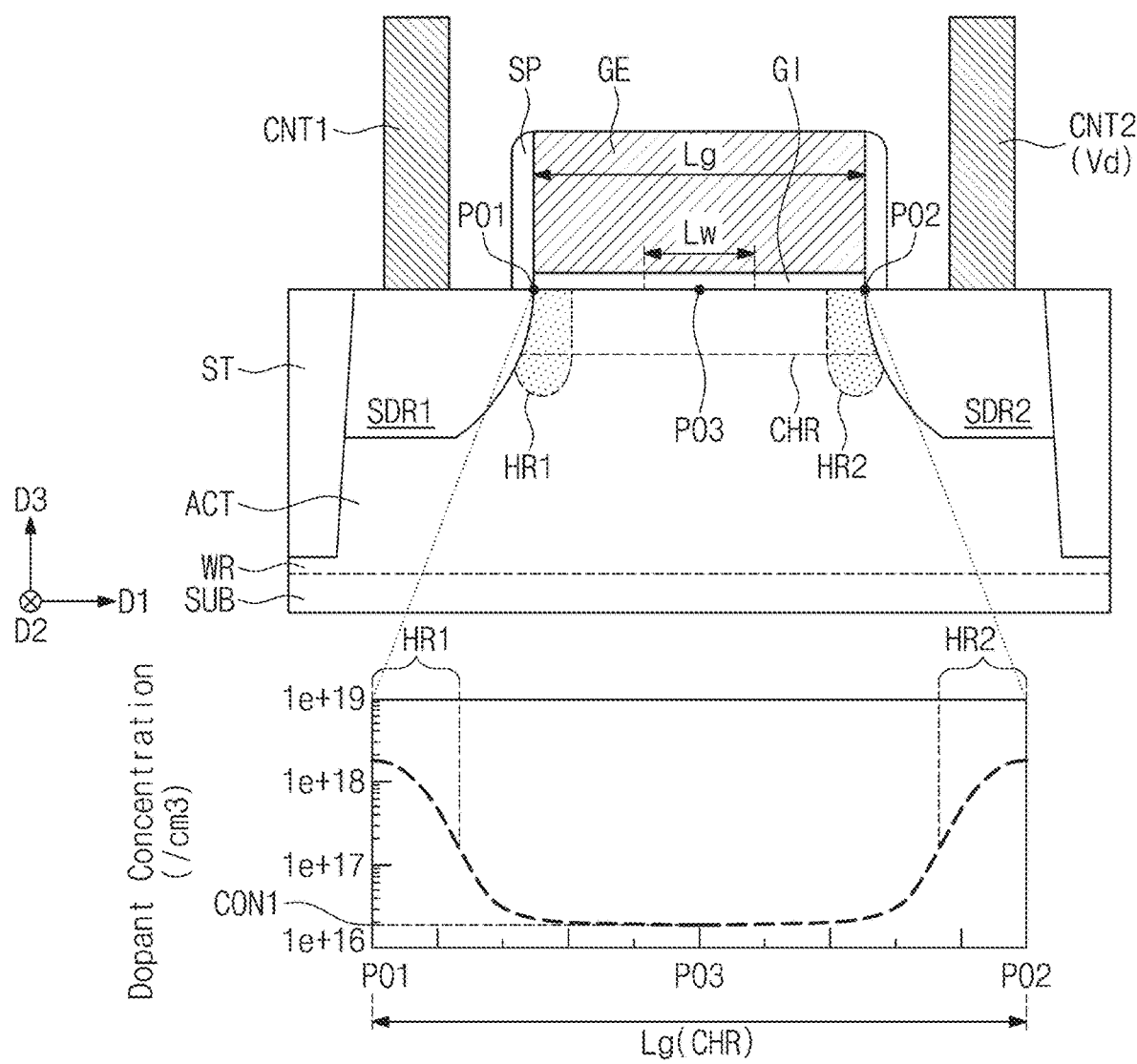
FIG. 3 is a sectional view illustrating a semiconductor device according to an example embodiment.

FIG. 3 is a sectional view illustrating a semiconductor device according to an example embodiment. Referring to FIG. 3, the slit well region SWR of FIGS. 1 and 2 may be omitted from a MOS transistor of FIG. 3. That is, the channel region CHR may include only the first and second halo regions HR1 and HR2, which are respectively provided in opposite side portions thereof.

A doping profile of the first impurities in the top surface of the channel region CHR according to the example embodiment will be described in more detail below. In a region from the first point PO1 toward the third point PO3, the dopant concentration may be decreased from the second concentration CON2 to the first concentration CON1. The second concentration CON2 may be equal to the highest dopant concentration in each of the first and second halo regions HR1 and HR2. The first concentration CON1 may be a dopant concentration of the channel region CHR, except for the first and second halo regions HR1 and HR2.

In the example embodiment, since the slit well region SWR is omitted, the dopant concentration at the third point PO3 may still be the first concentration CON1. As a distance to the second halo region HR2 decreases, the dopant concentration of the channel region CHR may be increased and may reach the second concentration CON2 at the second point PO2.

Figure 4:
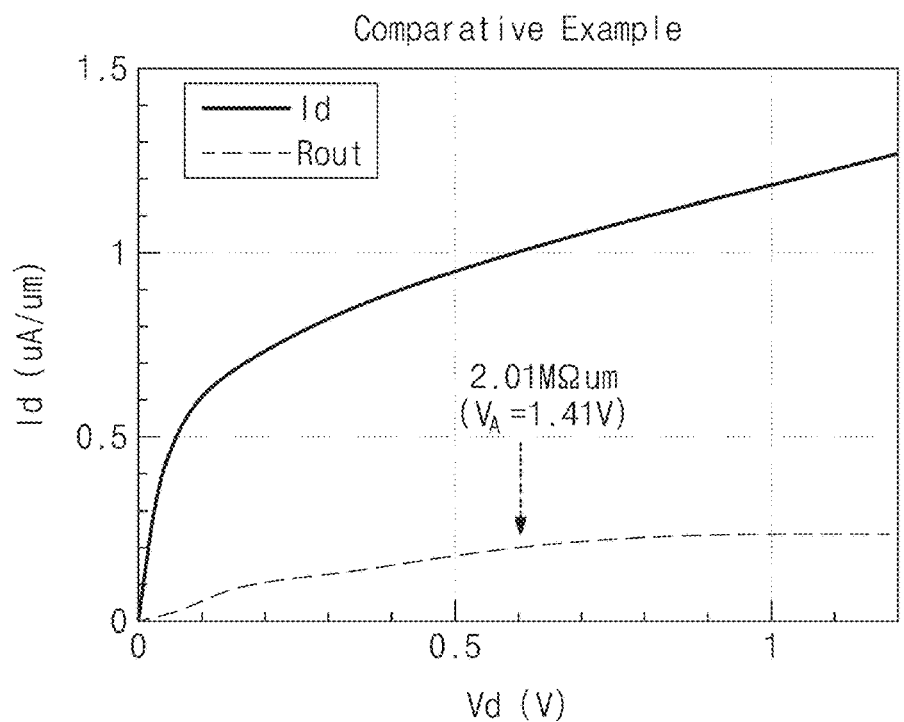
FIG. 4 is a graph showing Id-Vd characteristics of a transistor according to the example embodiment of FIG. 3.

FIG. 4 shows current-voltage (Id-Vd) characteristics measured from the transistor in the example embodiment of FIG. 3 (e.g., without the slit well region SWR). The slope in the graph of FIG. 4 may be inversely proportional to the output resistance Rout.

FIG. 4 shows that as the drain voltage Vd increases, the current Id is monotonically increased to have a relatively large slope. This means that the output resistance Rout has a relatively very small value. For example, the output resistance Rout may have a value of 2.01 MΩ μm at the drain voltage Vd of 0.6V.

The transistor according to the example embodiment of FIG. 3 may have a relatively large saturation current Id, and thus, the transistor may be operated with a high speed. That is, the transistor according to the example embodiment may be suitable for a digital circuit. However, the transistor according to the example embodiment may have a relatively small output resistance Rout as shown in FIG. 4, owing to the first and second halo regions HR1 and HR2, and this may result in a low gain issue, when the transistor is used for an analog circuit, such as an amplifying circuit. That is, the transistor according to the comparative example of FIG. 3 may not be suitable for an analog circuit, such as the amplifying circuit.

In the case where the first and second halo regions HR1 and HR2 are omitted from the transistor according to the example embodiment of FIG. 3, the output resistance Rout may have a relatively large value of 6.03 MΩ·μm. However, in the case where, as described above, the first and second halo regions HR1 and HR2 are omitted, a short channel effect may be largely increased, and there may be a difficulty in normally operating such a transistor.

Figure 5:
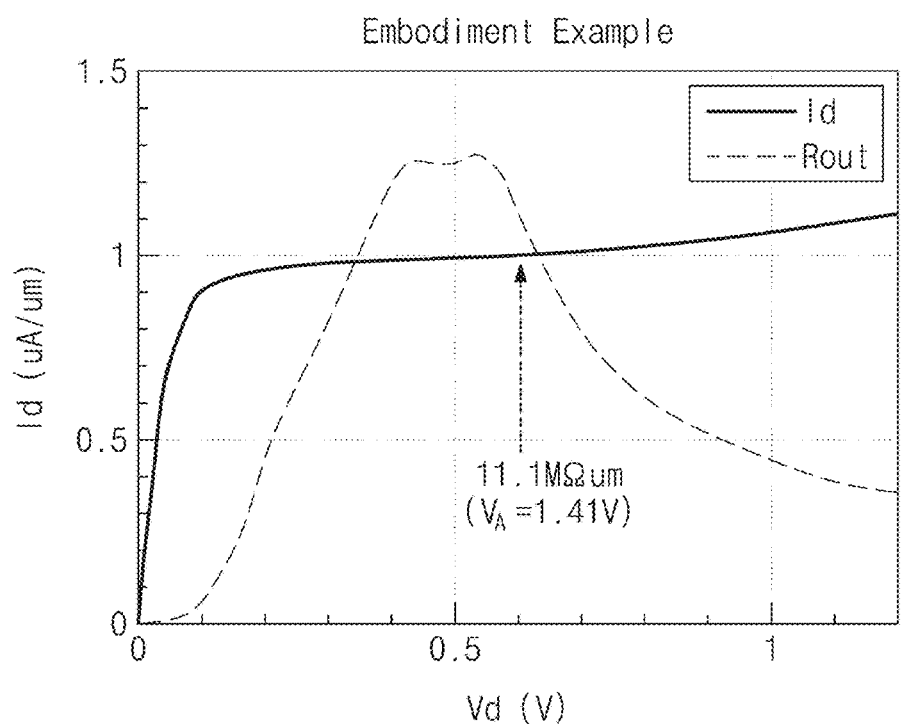
FIG. 5 is a graph showing Id-Vd characteristics of a transistor according to an example embodiment of the inventive concepts.

The transistor previously described with reference to FIGS. 1 and 2 may include the slit well region SWR, which is provided at a center point of the channel region CHR. FIG. 5 shows the Id-Vd curve measured from the transistor. The slope of the graph of FIG. 5 may be inversely proportional to the output resistance Rout.

FIG. 5 shows that, if the drain voltage Vd is increased to a value higher than 0.1V, an increase rate of the current Id is lowered, and the current is saturated. That is, the Id-Vd curve has a relatively small slope. This means that the output resistance Rout has a very large value. For example, the output resistance Rout of the transistor may have a value of 11.1 MΩ·μm at the drain voltage Vd of 0.6V. In particular, when the drain voltage Vd is 0.3V to 0.7V, the output resistance Rout may be very increased.

As illustrated in FIG. 5, the slit well region SWR may make it possible to increase the output resistance Rout in the transistor of FIGS. 1 and 2, even when the first and second halo regions HR1 and HR2 are provided in the transistor. Moreover, it may be possible to suppress a short channel effect. That is, the transistor according to an embodiment of the inventive concept may be suitable for an amplifying circuit, which is used to amplify signals.

Figure 6:
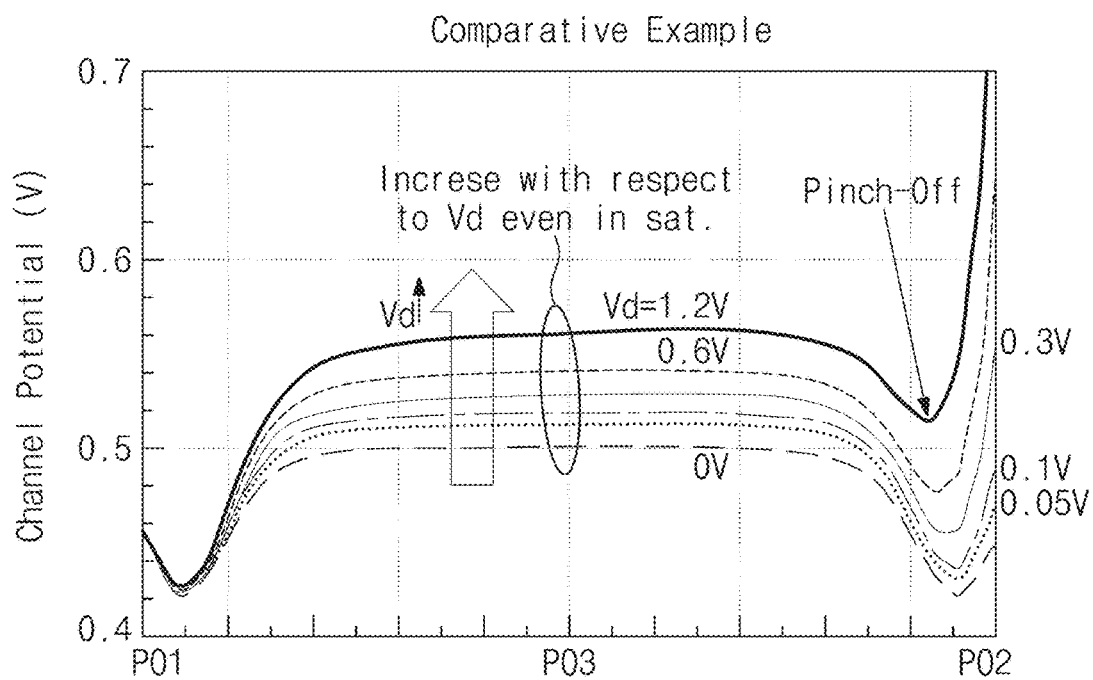
FIG. 6 is a graph showing an electric potential profile on a top surface of a channel region of a transistor according to the example embodiment of FIG. 3.

FIG. 6 is a graph showing an electric potential profile on the top surface of the channel region CHR of the transistor of FIG. 3 according to the example embodiment. FIG. 6 shows an electric potential profile of the channel region CHR measured while changing the drain voltage Vd of the transistor of FIG. 3 from 0V to 1.2V. FIG. 6 shows that a change of the drain voltage Vd from 0V to 1.2V results in a large change of an electric potential at the center point (e.g., the third point PO3) of the channel region CHR. This means that the transistor of FIG. 3 has a low output resistance Rout.

Figure 7:
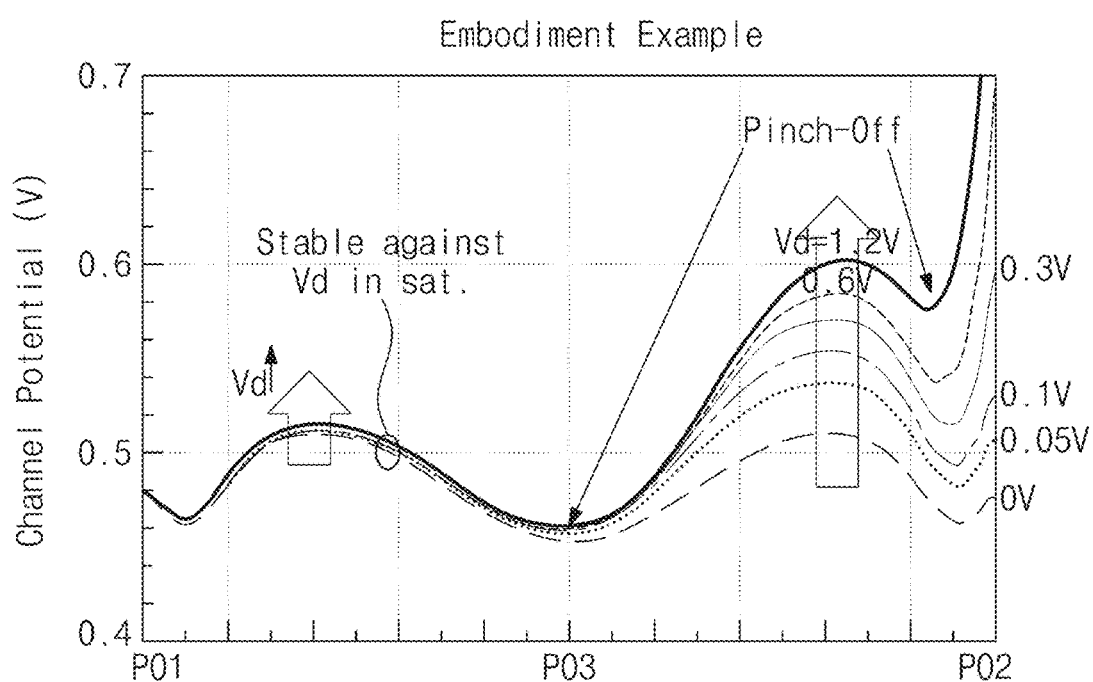
FIG. 7 is a graph showing an electric potential profile on a top surface of a channel region of a transistor according to an example embodiment of the inventive concepts.

FIG. 7 is a graph showing an electric potential profile on a top surface of the channel region CHR of the transistor according to the example embodiment of FIGS. 1 and 2. FIG. 7 shows an electric potential profile of the channel region CHR measured while changing the drain voltage Vd from 0V to 1.2V in the transistor of FIGS. 1 and 2. FIG. 7 shows that a pinch off occurred at the center point (e.g., the third point PO3) of the channel region CHR.

FIG. 7 shows that the electric potential at the third point PO3 is not substantially changed, when the drain voltage Vd is increased from 0V to 1.2V. That is, the channel region CHR adjacent to the drain region SDR2 (e.g., the second point PO2) may serve as a buffer of reducing a variation of the drain voltage Vd. Accordingly, a pinch-off property at the third point PO3 may be stabilized, and an electric potential of the channel region CHR adjacent to the source region SDR1 (e.g., the first point PO1) may be saturated. As a result, this may result in an increase of the output resistance Rout.

Figure 8:
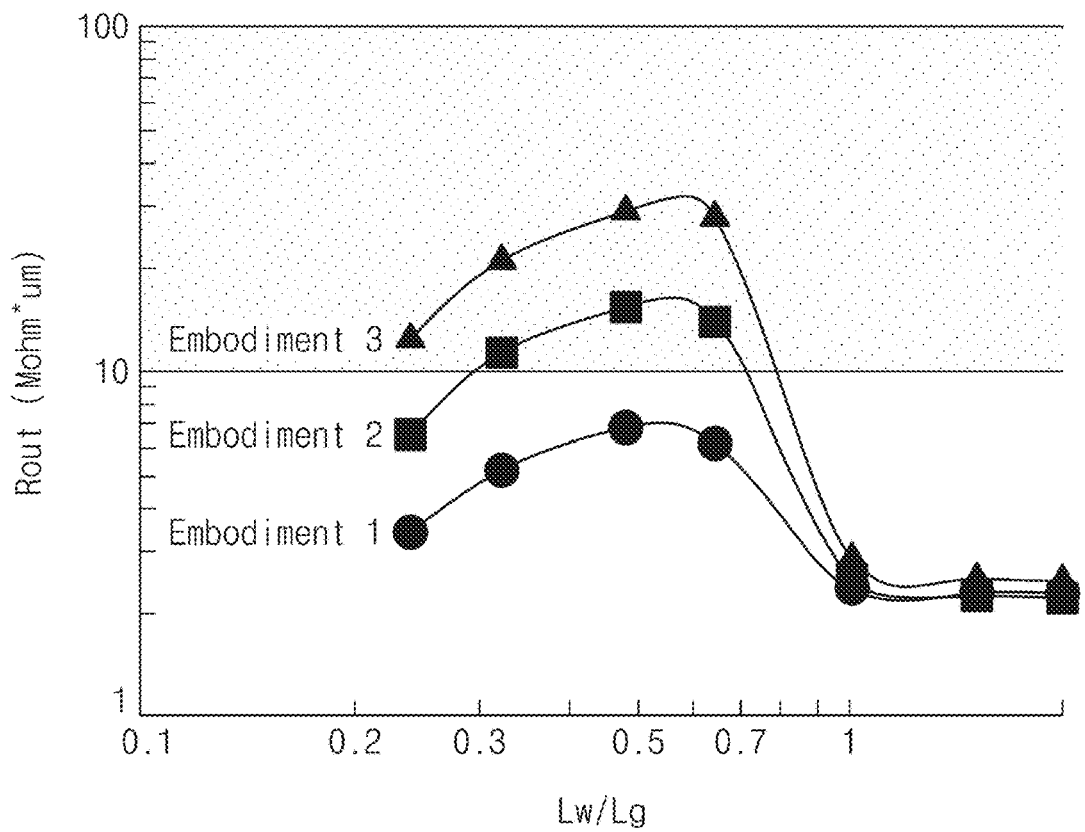
FIG. 8 is a graph showing a behavior of an output resistance Rout over a change of ratio Lw/Lg in a transistor according to an example embodiment of the inventive concepts.

FIG. 8 is a graph showing a behavior of the output resistance Rout over a change of ratio Lw/Lg in the transistor according to the example embodiment of FIGS. 1 and 2. In the example embodiment 1, the dopant concentration CON2 of the first and second halo regions HR1 and HR2 was equal to the dopant concentration CON4 of the slit well region SWR. In the example embodiment 2, the dopant concentration CON4 of the slit well region SWR was about 1.4 times higher than the dopant concentration CON2 of the first and second halo regions HR1 and HR2. In the example embodiment 3, the dopant concentration CON4 of the slit well region SWR was about 1.8 times higher than the dopant concentration CON2 of the first and second halo regions HR1 and HR2.

FIG. 8 shows that the output resistance Rout is increased as a ratio (Lw/Lg) of the length Lw of the slit well region SWR to the channel length Lg is changed from 0.2 to 0.6. However, the graph of FIG. 8 shows that if the ratio Lw/Lg is greater than 0.6, the output resistance Rout is decreased, and in particular, if it is greater than 0.7, the output resistance Rout is rapidly decreased. This result shows that it is possible to obtain a high output resistance Rout in the transistor, when the ratio of Lw/Lg is within a range of 0.2 to 0.7, in particular, of 0.2 to 0.6.

Figure 9:
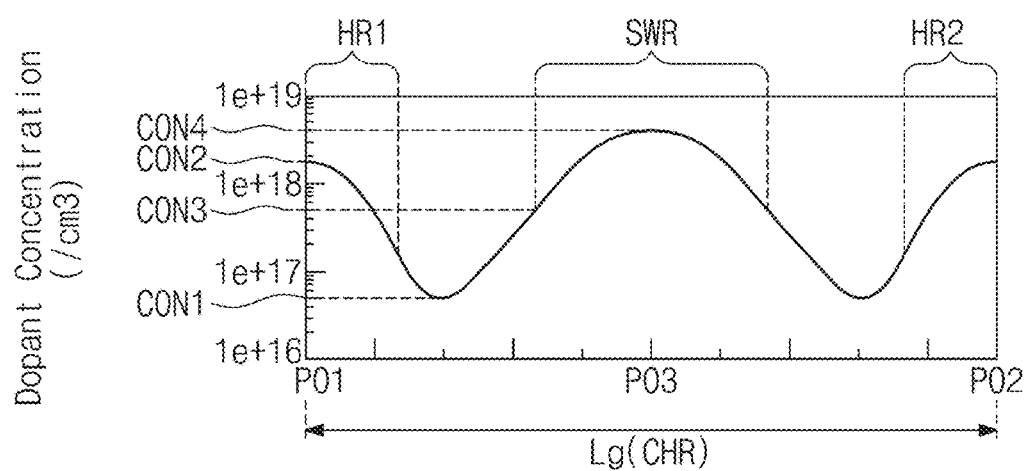
FIG. 9 is a graph illustrating a semiconductor device according to another example embodiment of the inventive concepts and showing an impurity doping profile in a region between first and second points of FIG. 2.

FIG. 9 is a graph illustrating a semiconductor device according to another example embodiment of the inventive concepts and showing an impurity doping profile in a region between the first and second points PO1 and PO2 of FIG. 2.

Referring to FIG. 9, the dopant concentration CON4 of the third point PO3 (e.g., the highest dopant concentration CON4 of the slit well region SWR) may be higher than the highest dopant concentration CON2 of the halo region HR1 or HR2. That is, the highest dopant concentration of the slit well region SWR according to an example embodiment of the inventive concepts may be lower than, equal to, or higher than the highest dopant concentration of the halo region HR1 or HR2. A ratio CON4/CON2 of the fourth concentration CON4 to the second concentration CON2 may be in a range from 0.5 to 2.

Figure 10:
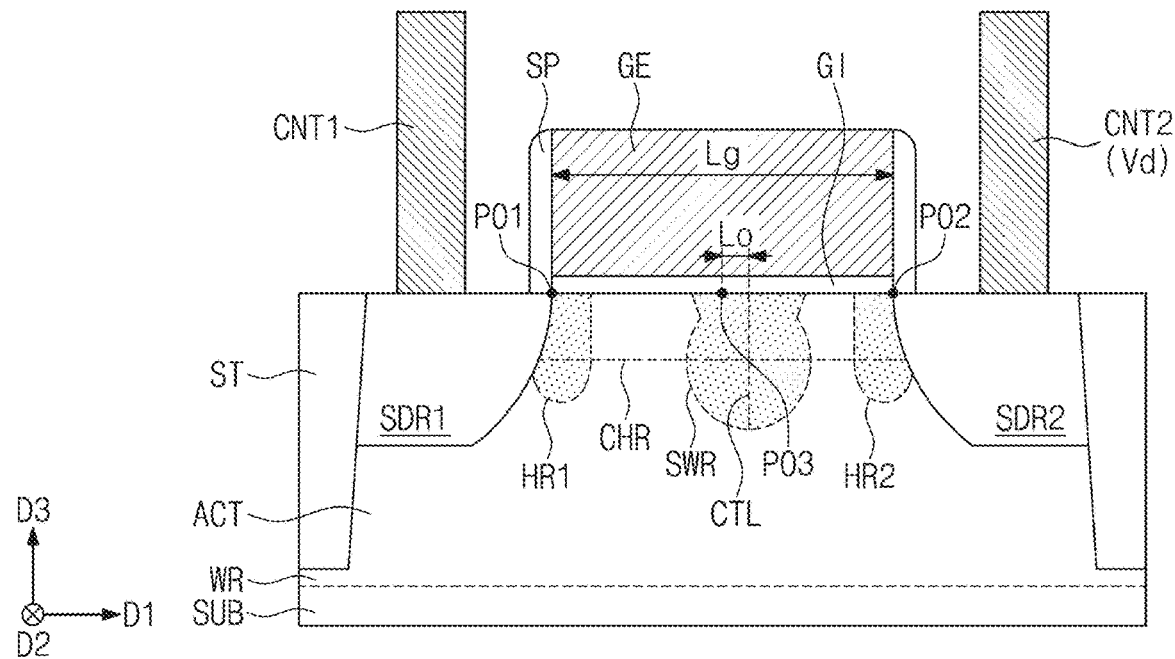
FIGS. 10 and 11 are sectional views, each of which is taken along a line A-A' of FIG. 1 to illustrate a semiconductor device according to another example embodiment of the inventive concepts.
Figure 11:
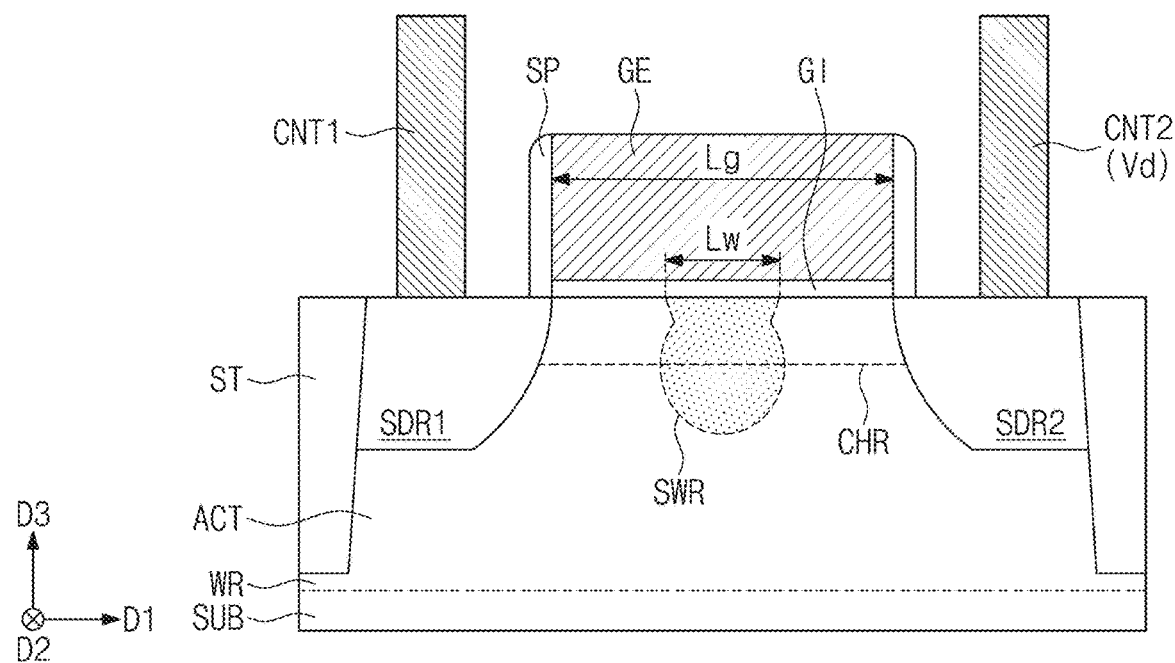

FIGS. 10 and 11 are sectional views, each of which is taken along a line A-A' of FIG. 1 to illustrate a semiconductor device according to another example embodiment of the inventive concepts. In the following description, an element previously described with reference to FIGS. 1 and 2 may be identified by the same reference number without repeating an overlapping description thereof, for concise description.

Referring to FIGS. 1 and 10, the slit well region SWR may be slightly offset from a center point of the channel region CHR in the first direction D1. In detail, a center line CTL may be defined to pass through a center of the slit well region SWR. The center line CTL may be spaced apart from the third point PO3 in the first direction D1.

The center line CTL may be offset from the third point PO3 by a third length Lo. A ratio (Lo/Lg) of the third length Lo to the first length Lg (i.e., the channel length) may be in a range from 0.01 to 0.1. In an example embodiment, since the slit well region SWR is slightly offset from the third point PO3, the output resistance Rout may be slightly increased or decreased. In another example embodiment, even when the slit well region SWR is slightly offset from the third point PO3, the output resistance Rout may not be changed.

Referring to FIGS. 1 and 11, the first and second halo regions HR1 and HR2 may be omitted. For example, only the slit well region SWR may be left in the channel region CHR. Since the first and second halo regions HR1 and HR2 are omitted, the output resistance Rout of the transistor according to the example embodiment may be increased to a very large value. Furthermore, by adjusting a dopant concentration of the channel region CHR or performing an additional doping process, it may be possible to inhibit or prevent a punch-through issue, which may be caused by omitting the first and second halo regions HR1 and HR2. The slit well region SWR may reduce a short channel effect which may occur when the first and second halo regions HR1 and HR2 are omitted.

Figure 12:
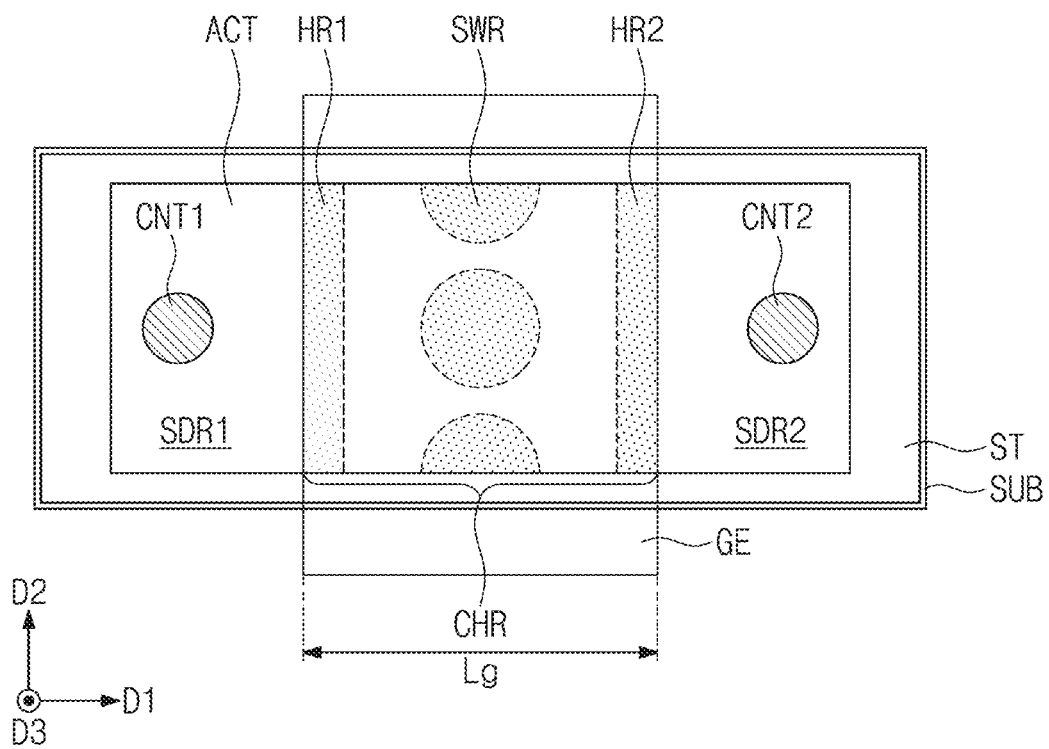
FIG. 12 is a plan view illustrating a semiconductor device according to another example embodiment of the inventive concepts.

FIG. 12 is a plan view illustrating a semiconductor device according to another example embodiment of the inventive concepts. In the following description, an element previously described with reference to FIGS. 1 and 2 may be identified by the same reference number without repeating an overlapping description thereof, for concise description.

Referring to FIG. 12, the slit well region SWR may have an island shape, when viewed in a plan view. In an example embodiment, a plurality of slit well regions SWR, which are spaced apart from each other, may be provided in the channel region CHR. The slit well regions SWR may be arranged in the second direction D2. If an implantation mask is used, the planar shape of the slit well region SWR may be variously changed. The output resistance Rout, a threshold voltage, and a breakdown voltage of a MOS transistor may be controlled to desired values by changing the planar shape of the slit well region SWR.

Figure 13:
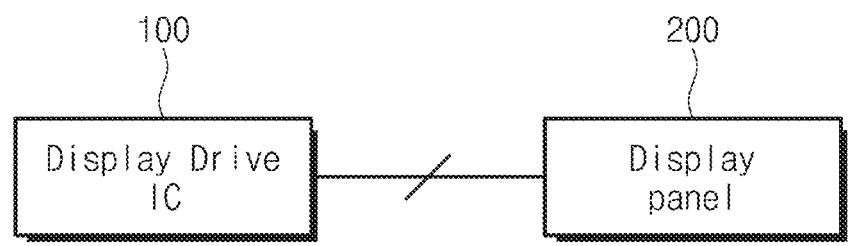
FIG. 13 is a schematic diagram illustrating a display device according to an example embodiment of the inventive concepts.

FIG. 13 is a schematic diagram illustrating a display device according to an example embodiment of the inventive concepts. Referring to FIG. 13, a display device 10 according to an example embodiment of the inventive concepts may include a display driver IC (DDI) 100 and a display panel 200. Referring to FIG. 13, the display driver IC 100 may be configured to control the display panel 200.

The display device 10 may include, for example, an organic light emitting display (OLED) device, a liquid crystal display (LCD) device, a plasma display panel (PDP) device, an electrochromic display (ECD) device, a digital mirror device (DMD) device, an actuated mirror device (AMD) device, a grating light value (GLV) device, a plasma display panel (PDP) device, or an electro luminescent display (ELD) device, but the inventive concepts are not limited to these examples.

Figure 14:
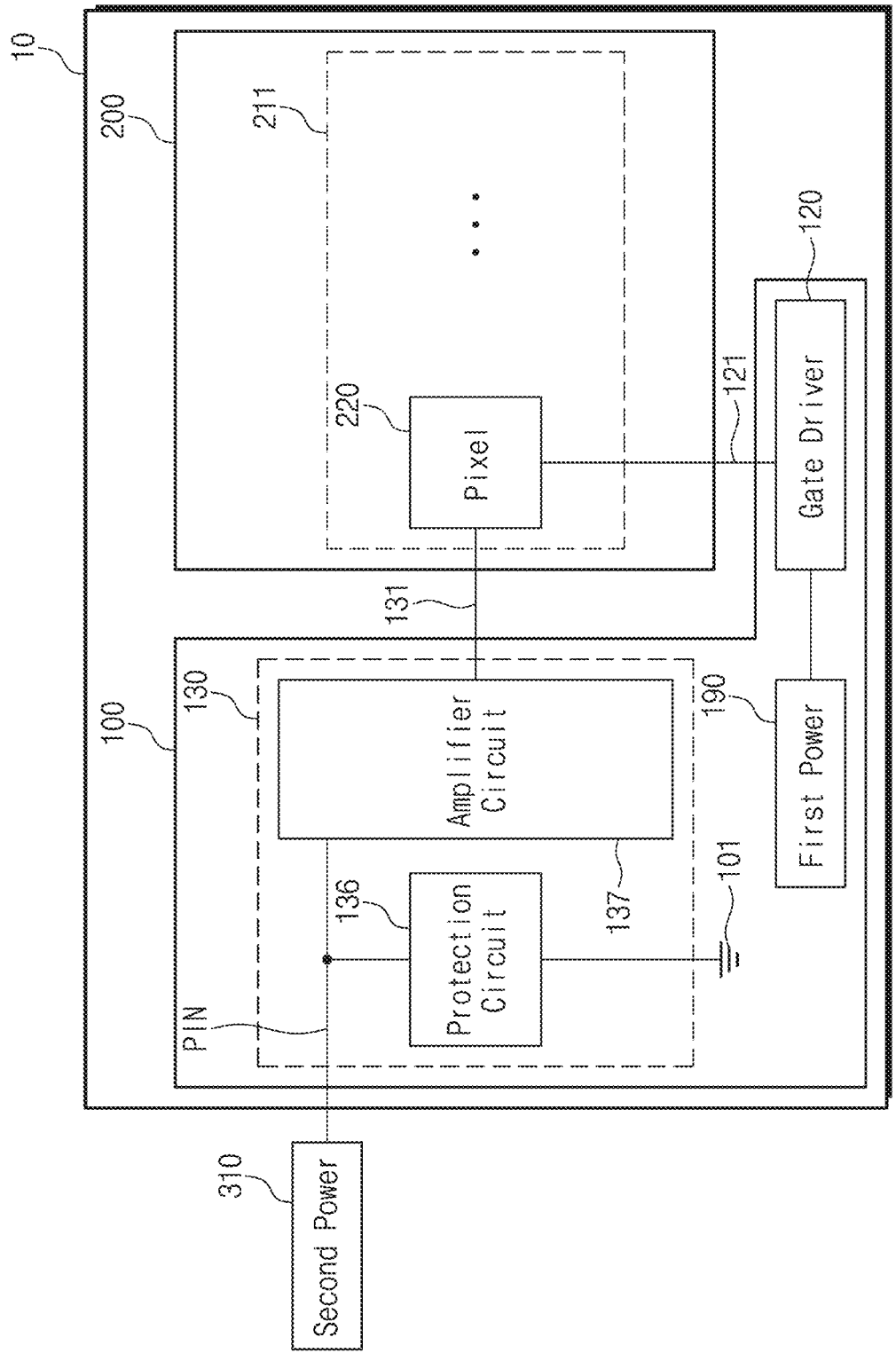
FIG. 14 is a block diagram illustrating a display device according to an example embodiment of the inventive concepts.

FIG. 14 is a block diagram illustrating a display device according to an example embodiment of the inventive concepts. Referring to FIG. 14, the display device 10 may include the display driver IC 100 and the display panel 200.

The display panel 200 may include a plurality of pixels 220. The pixel 220 may be turned-on by a gate voltage applied thereto to emit light having an intensity corresponding to a magnitude of a data voltage.

The display driver IC 100 may be disposed near a side portion of the display panel 200. The display driver IC 100 may be electrically connected to the display panel 200.

The display driver IC 100 may be electrically connected to lines, which are disposed in the display panel 200. For example, the display driver IC 100 may be connected to gate lines 121 and data lines 131 of the display panel 200. The display driver IC 100 may transmit signals to the display panel 200 through the gate line 121 and the data line 131. The display driver IC 100 may control an emission operation of the pixel 220, which is connected to the gate line 121 and the data line 131.

The display driver IC 100 may include a gate driver 120 and a source driver 130. The gate driver 120 may be electrically connected to the display panel 200 through the gate line 121. The gate driver 120 may be driven by an electric power, which is supplied from a first power 190. The gate driver 120 may apply a gate voltage to the data line 131, based on a gate control signal. A transistor in the pixel 220 may be turned-on by the gate voltage.

The source driver 130 may be configured to convert an image data to the data voltage. The data voltage may mean a voltage capable of charging a capacitive element (e.g., capacitor) in the pixel 220. The source driver 130 may supply the data voltage to the pixel 220 through the data line 131. If the capacitive element in the pixel 220 is charged to cause a current passing through a light-emitting element, the pixel 220 may emit light.

A plurality of the pixels 220, which are arranged in a row direction, may constitute a single pixel group 211. The pixel group 211 may receive the data voltage supplied from the source driver 130.

The source driver 130 may include at least one amplifier circuit 137. The amplifier circuit 137 may receive an electric power supplied from a second power 310. The second power 310 may be disposed outside the display driver IC 100. The amplifier circuit 137 may be connected to the pixels 220 in the pixel group 211. The amplifier circuit 137 may be driven by an electric power supplied from the second power 310. The amplifier circuit 137 may change a magnitude of the data voltage by a desired (or alternatively, predetermined) gain. The amplifier circuit 137 may output the data voltage to the pixel 220.

The amplifier circuit 137 may include the MOS transistor according to the afore-described example embodiment (e.g., see FIGS. 1 and 2). Due to the afore-described slit well region SWR, the transistor may have a relatively large output resistance Rout as described above, and thus, it may be possible to achieve a high gain. That is, in the case where the transistor is used as a part of the amplifier circuit 137, it may be possible to efficiently amplify a magnitude of the data voltage.

The display driver IC 100 may include at least one protection circuit 136, which is connected to a power input terminal PIN of the amplifier circuit 137. The power input terminal PIN, to which the protection circuit 136 is connected, may be placed between the second power 310 and the source driver 130. The protection circuit 136 may be connected to a ground 101 of the display driver IC 100. In an example embodiment, the protection circuit 136 may be provided in the source driver 130. In another example embodiment, the protection circuit 136 may be a separate chip, which is provided outside the source driver 130.

If a voltage supplied from the second power 310 is not within a normal range, the voltage may be adjusted by the protection circuit 136 to be within the normal range. Thus, the protection circuit 136 may be configured to maintain a magnitude of the voltage supplied to the amplifier circuit 137 to a constant level or an allowed range. For example, in the case where additional electric charges are produced by an electro-static discharging (ESD) phenomenon, the protection circuit 136 may be configured to discharge the electric charges, which are produced by the ESD phenomenon, to the ground 101. That is, the protection circuit 136 may be used as an ESD-protection circuit.

The pixel 220 may be electrically connected to the amplifier circuit 137 of the source driver 130, to which the electric power from the second power 310 is supplied. The pixel 220 may receive the data voltage from one or more amplifier circuits 137. The pixel 220 may be electrically connected to the gate driver 120, to which the electric power from the first power 190 is supplied. In an example embodiment, the first power 190 may be an element that is different or distinct from the second power 310. The pixel 220 may receive the gate voltage from the gate driver 120.

Figure 15:
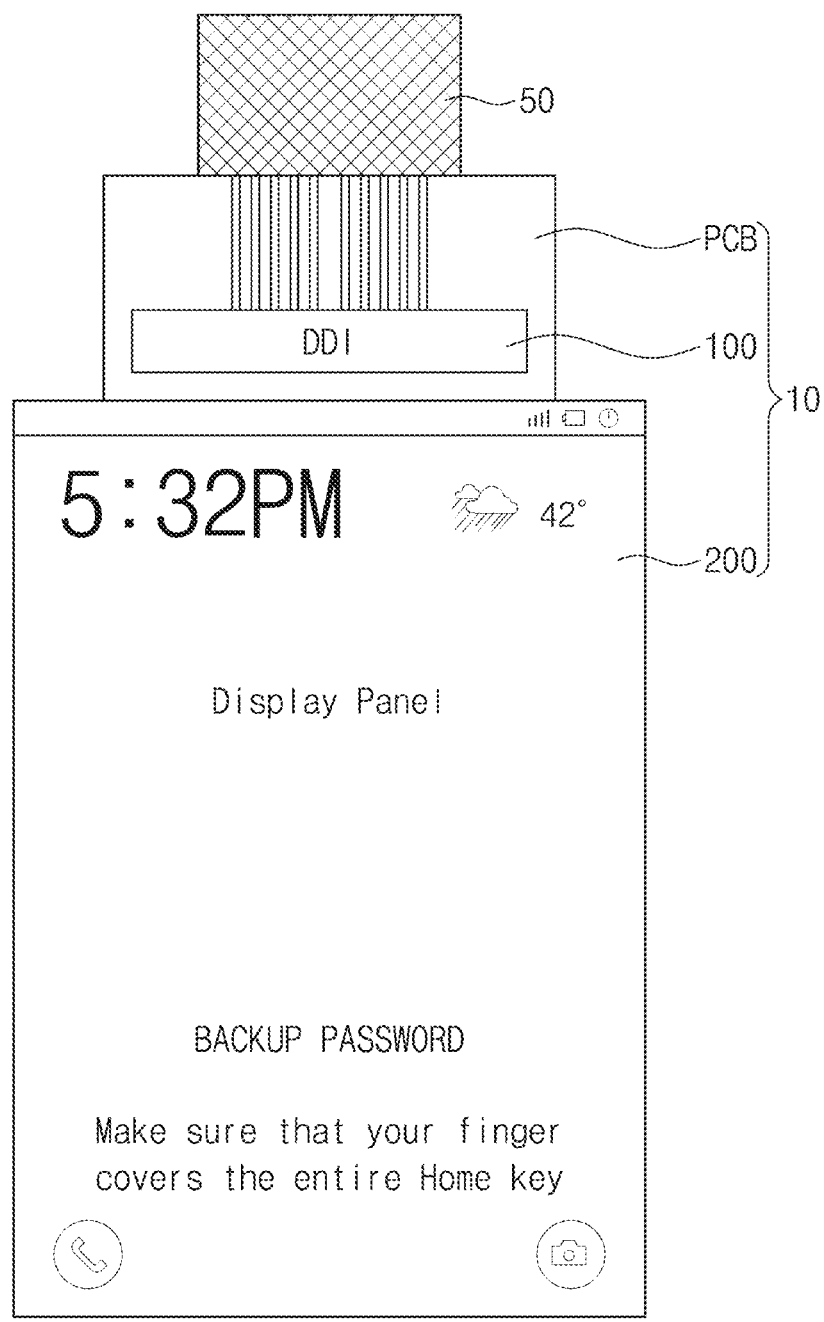
FIG. 15 is a conceptual diagram illustrating a display device, which includes a display driver IC according to an example embodiment of the inventive concepts.

FIG. 15 is a conceptual diagram illustrating a display device, which includes a display driver IC according to an example embodiment of the inventive concepts. Referring to FIG. 15, the display device 10 may include the display panel 200, the display driver IC 100, and a printed circuit board (PCB) substrate PCB. The display panel 200, the display driver IC 100, and a processor 50 may be connected to each other through the PCB substrate PCB.

In the case where an electronic device including the display device 10 is a mobile device, the PCB substrate PCB may include a flexible PCB substrate. The flexible PCB substrate may be folded and unfolded, and the display driver IC 100 and the processor 50 may be mounted on the flexible PCB substrate. In an example embodiment, the flexible PCB substrate may be folded such that the display driver IC 100 and the processor 50 are placed on a rear surface of the display panel 200.

According to an example embodiment of the inventive concepts, by forming a slit well region at a center point of a channel region of a MOS transistor, it may be possible to reduce a short channel effect and to improve an output resistance. In the case where the transistor is used as a part of an amplifier circuit, it may be possible to achieve high gain and to efficiently amplify an input signal.

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While some example embodiments of the inventive concepts have been particularly shown and described, it will be understood by one of ordinary skill in the art that variations in form and detail may be made therein without departing from the scope of the inventive concepts.

What is claimed is:

1. A semiconductor device, comprising:
   a semiconductor substrate including an active region, the active region defined in a well impurity layer having a first conductivity type;
   a gate electrode on the active region; and
   a gate insulating layer between the gate electrode and the active region,
   wherein the active region comprises
   a source region and a drain region, the source region at a first side of the gate electrode, the drain region at a second side of the gate electrode, and the source region and the drain region having a second conductivity type,
   a channel region between the source and drain regions, the channel region having the first conductivity type,
   a first halo region in contact with the source region and a second halo region in contact with the drain region, the first halo region and the second halo region having the first conductivity type, and
   a slit well region between the first and second halo regions, the slit well region having the first conductivity type, wherein a top surface of the slit well region is in contact with a bottom surface of the gate insulating layer.

2. The semiconductor device of claim 1, wherein
   a highest dopant concentration of the first halo region is a first concentration,
   a lowest dopant concentration between the first halo region and the slit well region is a second concentration,
   a highest dopant concentration of the slit well region is a third concentration,
   a lowest dopant concentration between the slit well region and the second halo region is a fourth concentration,
   a highest dopant concentration of the second halo region is a fifth concentration,
   in a direction from the first halo region toward the slit well region, a dopant concentration of the channel region decreases from the first concentration to the second concentration and then increases to the third concentration, and
   in a direction from the slit well region toward the second halo region, the dopant concentration of the channel region decreases from the third concentration to the fourth concentration and then increases to the fifth concentration.

3. The semiconductor device of claim 2, wherein a ratio of the third concentration to the first concentration is in a range from 0.5 to 2.

4. The semiconductor device of claim 1, wherein upper portions of the first and second halo regions and an upper portion of the slit well region define the channel region.

5. The semiconductor device of claim 1, wherein
   the source and drain regions are spaced apart from each other in a first direction,
   the gate electrode has a first length in the first direction,
   the top surface of the slit well region has a second length in the first direction, and
   a ratio of the second length to the first length is in a range from 0.2 to 0.6.

6. The semiconductor device of claim 1, wherein a ratio of a lowest dopant concentration of the slit well region to a dopant concentration of the channel region is in a range from 3 to 20.

7. The semiconductor device of claim 1, wherein
   the gate electrode extends in a first direction when viewed in a plan view, and
   the slit well region has a line shape extending along the gate electrode in the first direction.

8. The semiconductor device of claim 1, wherein
   the gate electrode extends in a first direction, when viewed in a plan view,
   the slit well region comprises a plurality of island-shaped slit well regions, and the plurality of island-shaped slit well regions are arranged in the first direction.

9. The semiconductor device of claim 1, wherein
the source and drain regions are spaced apart from each other in a first direction,
the gate electrode has a first length in the first direction,
a center of the slit well region is offset from a center of the channel region by a second length in the first direction, and
a ratio of the second length to the first length is in a range from 0.01 to 0.1.

10. The semiconductor device of claim 1, wherein a dopant concentration of the slit well region is in a range from 2.0 E17 atom/cm$^3$ to 1.0 E19 atom/cm$^3$.

11. A semiconductor device, comprising:
a semiconductor substrate including an active region, the active region defined in a well impurity layer having a first conductivity type;
a gate electrode on the active region; and
a gate insulating layer between the gate electrode and the active region,
wherein the active region comprises
a source region at a first side of the gate electrode and a drain region at a second side of the gate electrode, the source region and the drain region having a second conductivity type,
a channel region between the source and drain regions, the channel region having the first conductivity type,
a first halo region in contact with the source region and a second halo region in contact with the drain region, the first halo region and the second halo region having the first conductivity type, and
a slit well region between the first and second halo regions, the slit well region having the first conductivity type,
wherein a top surface of the channel region comprises a first point in contact with the source region, a second point in contact with the drain region, a third point at a center point of the top surface, a fourth point between the first and third points, and a fifth point between the third and second points,
wherein the first and second points have a first dopant concentration,
wherein the third point has a second dopant concentration,
wherein the fourth and fifth points have a third dopant concentration,
wherein the third dopant concentration is lower than the first dopant concentration, and
wherein the third dopant concentration is lower than the second dopant concentration.

12. The semiconductor device of claim 11, wherein the slit well region extends vertically extended from the top surface of the channel region toward a bottom surface of the semiconductor substrate.

13. The semiconductor device of claim 12, wherein a section of the slit well region has a circular, elliptical, pear, or pot shape.

14. The semiconductor device of claim 11, wherein
the source and drain regions are spaced apart from each other in a first direction,
the gate electrode has a first length in the first direction,
a top surface of the slit well region has a second length in the first direction, and
a ratio of the second length to the first length is in a range from 0.2 to 0.6.

15. The semiconductor device of claim 11, wherein a ratio of the second dopant concentration to the first dopant concentration is in a range from 0.5 to 2.

16. A display driver integrated circuit (IC), comprising:
a source driver including an amplifier circuit; and
a gate driver, wherein the source driver and the gate driver are configured to drive a pixel of a display panel,
wherein a metal-oxide-semiconductor (MOS) transistor of the amplifier circuit comprises
a semiconductor substrate including a well impurity layer having a first conductivity type,
a source region and a drain region in an upper portion of the well impurity layer, the source region and the drain region spaced apart from each other in a first direction, and the source region and the drain region having a second conductivity type,
a channel region between the source and drain regions, the channel region having the first conductivity type,
a slit well region at a center point of the channel region, the slit well region having the first conductivity type, and
a gate electrode on the channel region,
wherein the gate electrode has a first length in the first direction,
wherein a top surface of the slit well region has a second length in the first direction, and
wherein a ratio of the second length to the first length is in a range from 0.2 to 0.6.

17. The display driver IC of claim 16, wherein
the MOS transistor further comprises a gate insulating layer between the gate electrode and the channel region, and
the top surface of the slit well region is in contact with a bottom surface of the gate insulating layer.

18. The display driver IC of claim 16, wherein a dopant concentration of the slit well region is in a range from 2.0 E17 atom/cm$^3$ to 1.0 E19 atom/cm$^3$.

19. The display driver IC of claim 16, wherein
the MOS transistor further comprises a first halo region in contact with the source region and a second halo region in contact with the drain region,
the first and second halo regions have the first conductivity type,
a dopant concentration of each of the first and second halo regions is higher than a dopant concentration of the channel region, and
a dopant concentration of the slit well region is higher than the dopant concentration of the channel region.

20. The display driver IC of claim 16, wherein a ratio of a lowest dopant concentration of the slit well region to a dopant concentration of the channel region is in a range from 3 to 20.

* * * * *